United States Patent [19]

Yakuwa et al.

[11] Patent Number: 4,764,729
[45] Date of Patent: Aug. 16, 1988

[54] METHOD OF DETECTING ABNORMALITY IN ELECTROMAGNETIC VALVE CURRENT CONTROLLER

[75] Inventors: Masahiko Yakuwa; Takashi Satoh, both of Wako, Japan

[73] Assignee: Honda Giken Kogyo K.K., Tokyo, Japan

[21] Appl. No.: 13,329

[22] Filed: Feb. 11, 1987

[30] Foreign Application Priority Data

Feb. 14, 1986 [JP] Japan .................. 61-030111

[51] Int. Cl.$^4$ ........................................... G01R 31/02
[52] U.S. Cl. .................................. 324/546; 324/418; 324/509
[58] Field of Search ............... 324/546, 547, 509, 418; 340/650

[56] References Cited

U.S. PATENT DOCUMENTS 4,242,674 12/1980 Wheeler ..................... 340/650 X
4,449,502 5/1984 Furuhashi ................... 123/479 X
4,628,268 12/1986 Matsubara ........................ 324/418

Primary Examiner—Reinhard J. Eisenzopf
Assistant Examiner—Robert W. Mueller
Attorney, Agent, or Firm—Arthur L. Lessler

[57] ABSTRACT

An electromagnetic valve used in controlling the amount of supplementary air supplied to an internal combustion engine to control the idling operation thereof is controlled by a current controller. The actual value of current flowing through the electromagnetic valve is compared with a predetermined value when a control signal, which is applied to the controller to regulate the opening of the electromagnetic valve, and the actual value of the current do not exhibit a predetermined correlation. It is determined whether an abnormality in the current controller is a disconnection or a short circuit based on whether the actual value of the current is greater than the predetermined value.

5 Claims, 7 Drawing Sheets

METHOD OF DETECTING ABNORMALITY IN ELECTROMAGNETIC VALVE CURRENT CONTROLLER

BACKGROUND OF THE INVENTION

This invention relates to a method of detecting an abnormality in an electromagnetic valve current controller. More particularly, the invention relates to a method of detecting an abnormality in the current controller of an electromagnetic valve used in controlling the amount of supplementary air supplied to an internal combustion engine to control the idling operation thereof.

Duty ratio control-type electromagnetic valves have been in general use as valves for controlling the amount of supplementary air supplied to an internal combustion engine in order to control its idling operation. Recently, however, a proportional control-type electromagnetic valve (hereafter referred to as a "proportional electromagnetic valve") which features more reliable control has come into use for this purpose. A proportional electromagnetic valve ordinarily is of the normally closed type and includes a valve body capable of continuously changing the opening area of the passageway in which the valve is installed, a spring for biasing the valve body in the closing direction, and an electromagnetic solenoid which, when energized, moves the valve body in the opening direction against the biasing force produced by the spring. The amount of current supplied to the solenoid to energize it is regulated by a current controller, and the area opened by the valve body or valve opening area takes on a value proportional to the amount of energizing current supplied.

Accidents can occur in which the current controller for the electromagnetic valve and the solenoid are severed or disconnected from each other or short circuited. If the two are severed, the solenoid can no longer be energized and the valve body will be forced to close the valve due to the biasing force of the spring. In the event of a short circuit, on the other hand, the maximum amount of energizing current will flow through the solenoid so that the valve body will assume a position that maximizes the valve opening area. Malfunctions of this type have a deleterious effect upon engine idling. In particular, the aforementioned short circuit results in an excessive amount of supplementary air for control of idling operation, thereby causing the idling rotational speed of the engine to rise abnormally.

SUMMARY OF THE INVENTION

It is therefore an object of the invention to provide a method of detecting an abnormality in an electromagnetic valve current controller, wherein a disconnection and a short circuit between the current controller and the proportional electromagnetic valve are detected separately and measures can be taken which are appropriate for the disconnection and short circuit, respectively.

According to the invention, the foregoing object is attained by providing a method of detecting an abnormality in an electromagnetic valve current controller of the type in which a power supply, a proportional control-type electromagnetic valve, a current control element for controlling current flowing into the electromagnetic valve in dependence upon a control signal supplied to the current control element by control means to thereby regulate the opening of the electromagnetic valve, and a current sensing element for sensing an actual value of the current flowing into the electromagnetic valve are connected in series to ground, and the control signal supplied to the current control element is controlled in a feedback manner responsive to the actual value of the current sensed by the current sensing element, in a manner such that the actual value of the current approaches a target value of current that flows into the electromagnetic valve.

The method according to the invention is characterized by comprising the following steps:

(a) determining whether the control signal and the actual value of the current exhibit a predetermined correlation;

(b) comparing the actual value of the current with a predetermined value when it is determined that the control signal and the actual value of current do not exhibit the predetermined correlation; and (c) determining whether the current controller is open or short circuited based on whether the actual value of the current is greater than the predetermined value.

The predetermined correlation between the control signal and the actual value of the current is satisfied when the electromagnetic valve current controller is operating normally.

The above and other objects, features and advantages of the invention will be apparent from the following detailed description taken in conjunction with the accompanying drawings.

DETAILED DESCRIPTION

A preferred embodiment of a method in accordance with the invention will now be described with reference to the drawings.

Figure 1:
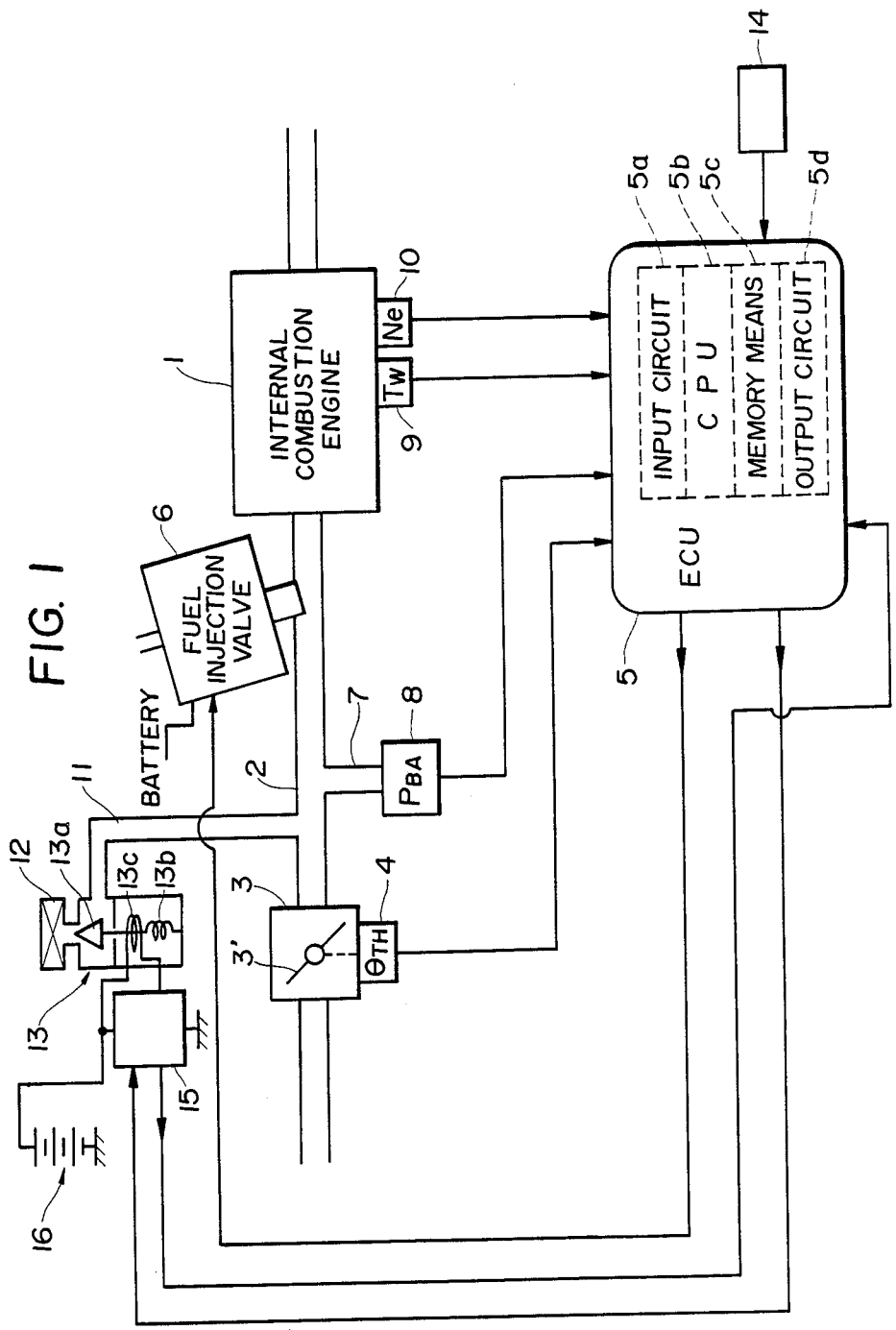
FIG. 1 is a schematic diagram showing the overall construction of a fuel supply control system of an internal combustion engine having an electromagnetic valve current controller to which the abnormality detection method of the present invention is applied.

FIG. 1 shows the overall construction of a fuel supply control system for an internal combustion engine to which the method of the invention is applied. The internal combustion engine, designated by numeral 1, is e.g. of the four-cylinder type and has an intake pipe 2 connected thereto. The intake pipe 2 is provided at a point along its length with a throttle body 3 housing a throttle valve 3'. A throttle valve opening ($\theta$TH) sensor 4 is connected to the throttle valve 3' for converting the sensed opening of the throttle valve 3' into an electric signal delivered from the sensor to an electronic control unit (hereinafter referred to as "the ECU") 5.

A fuel injection valve 6 for each one of the engine cylinders is provided in the intake pipe 2 between the engine 1 and the throttle body 3 at a location slightly upstream of the intake valve (not shown) of each cylinder. Each fuel injection valve 6 is connected to a fuel pump, not shown, and is electrically connected to the ECU 5. The period of time during which each valve 6 is opened to inject fuel is controlled by a signal from the ECU 5.

Connected to the intake pipe 2 between the fuel injection valve 6 and the throttle body 3 is one end of an air passageway 11 for bringing the interior of the intake pipe 2 into communication with the atmosphere. The other end of the air passageway 11 is open to the atmosphere and has an air cleaner 12 attached thereto. Arranged in the air passageway 11 at a point along its length is a proportional electromagnetic valve 13 for controlling the amount of supplementary air supplied to the engine. The proportional electromagnetic valve 13 is of the normally closed type and includes a valve body 13a capable of continuously changing the opening area of the air passageway 11, a spring 13b for biasing the valve body 13a in the closing direction, and an electromagnetic solenoid 13c which, when energized, moves the valve body 13a in the opening direction against the biasing force produced by the spring 13b. The amount of energizing current supplied to the solenoid 13c of the proportional electromagnetic valve 13 is regulated by the ECU 5 in such a manner that the rotational speed of the engine attains a desired idling speed set in dependence upon operating conditions and load of the engine. An electromagnetic valve current controller 15 is electrically connected to the solenoid 13c to energize the solenoid 13c with a current that conforms to the duty ratio of a duty ratio control signal received from the ECU 5.

An absolute pressure (PBA) sensor 8 is connected to the intake pipe 2 via a pipe 7 at a point downstream of the throttle valve 3' of the throttle body 3. An electric signal indicative of absolute pressure in the intake pipe 2 downstream of the throttle valve 3 is produced by the absolute pressure sensor 8 and delivered to the ECU 5.

The engine 1 has an engine coolant temperature sensor (hereinafter referred to as "the Tw sensor") 9 provided on its body. The Tw sensor 9, which comprises such a component as a thermistor, is mounted in the peripheral wall of a cylinder filled with engine coolant and supplies the ECU 5 with an electric signal indicative of the sensed coolant temperature. An engine rotational speed sensor (hereinafter referred to as "the Ne sensor") 10 is mounted in facing relation to the engine camshaft or crankshaft, not shown. The Ne sensor 10 outputs a crank angle position signal (hereinafter referred to as "the TDC" signal) at a predetermined crank angle position whenever the engine crankshaft rotates through 180°, namely at a crank angle position which is a predetermined crank angle before top dead center (TDC) at the start of the suction stroke of each cylinder. The TDC signal is delivered to the ECU 5.

Also connected to the ECU 5 are other parameter sensors 14 such as an atmospheric pressure sensor. These parameter sensors 14 supply the ECU 5 with their output signals representing the particular physical quantities sensed.

The ECU 5 comprises an input circuit 5a which functions to shape the waveforms of input signals from various sensors, shift the voltage levels of input signals from other sensors to a predetermined level and convert the values of analog signals from the other sensors into digital signal values, a central processing circuit (hereinafter referred to as "the CPU") 5b, memory means 5c for storing various arithmetic programs executed by the CPU 5b as well as the results of calculations, and an output circuit 5d for supplying the fuel injection valves 6 with driving signals.

Whenever the TDC signal is applied thereto, the CPU 5b calculates the fuel injection period TOUT of the fuel injection valves 6 by using the following equation, based on engine parameter signals outputted by various sensors and delivered to the CPU 5b via the input circuit 5a:

$$TOUT = Ti \times K_1 + K_2 \tag{1}$$

where Ti represents a basic value of the fuel injection period during which the fuel injection valve 6 injects fuel. The value of Ti is determined in dependence upon engine rotational speed Ne and absolute pressure PBA in the engine intake pipe. Further, $K_1$ and $K_2$ represent correction coefficients and correction variables calculated on the basis of predetermined formulae, based on engine parameter signals from the aforementioned sensors, so as to optimize such characteristics of the engine as the startability, emission characteristics, fuel consumption and accelerability, which conform to operating conditions of the engine.

The CPU 5b supplies each fuel injection valve 6 with a driving signal via the output circuit 5d to open the valve 6 for the fuel injection period TOUT obtained as set forth above.

When the engine 1 is idling, as when the throttle valve opening sensor 4 senses that the throttle valve is fully closed, the CPU 5b causes the electromagnetic solenoid 13c of the proportional electromagnetic valve 13 to be supplied with current from a battery 16 in FIG. 1, which is controlled by the current controller 15, on the basis of engine parameter signals from various sensors delivered through the input circuit 5a whenever an interrupt signal from a timer is inputted at predetermined time intervals.

Figure 2:
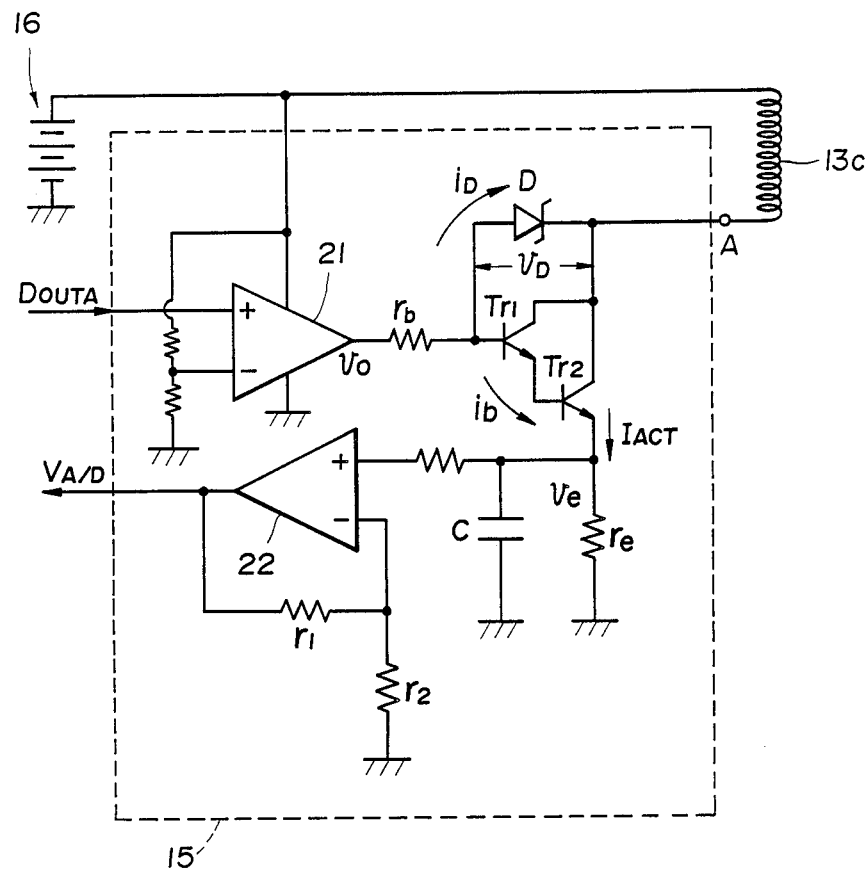
FIG. 2 is a circuit diagram of the electromagnetic valve current controller.
Figure 3:
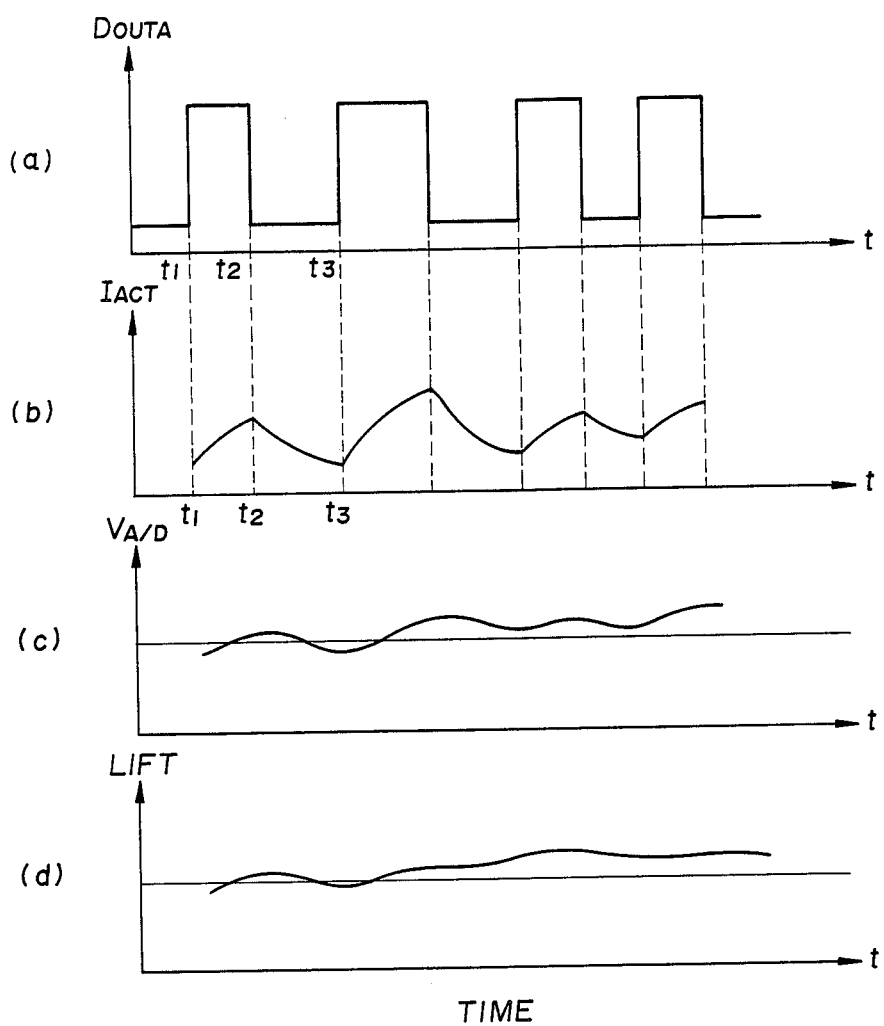

FIG. 2 is a circuit diagram illustrating the circuit construction of the current controller 15 for the electromagnetic valve 13. The operation of this circuit will now be described with reference to the timing chart of FIG. 3.

The current controller 15 includes a comparator 21, an amplifier 22 and Darlington-connected transistors Tr1, Tr2 serving as current control elements. A duty ratio control signal DOUTA which the ECU 5 applies to the current controller 15 is a pulsed current of the kind shown at (a) in FIG. 3. The pulsed current is inputted to the comparator 21, which is adapted to apply a high-level base voltage to the transistor Tr1 through a base resistance rb when the pulsed current is at a high level, and to supply the transistor Tr1 with a low-level base signal via the base resistance rb when the pulsed current is at a low level. Accordingly, when the pulsed current from the ECU 5 is at the high level [e.g. from time t1 to time t2 in (a) of FIG. 3], both of the transistors Tr1, Tr2 turn on so that a current from the positive terminal of the battery 16 flows into the solenoid 13c of the proportional electromagnetic valve 13 as an actual current IACT. This current flows to ground through the transistor Tr2 and an emitter resistance re, which acts as a current sensing element. The actual current IACT gradually increases at a predetermined time constant in e.g. the period from time t1 to time t2, as shown in (b) of FIG. 3, due to the self-inductance of the solenoid 13c. Next, when the pulsed current from the ECU 5 assumes the low level [e.g. at time t2 in (a) of FIG. 3], the base voltage of transistor Tr1 falls to the low level. However, when the actual current IACT flowing into the solenoid 13c is large in magnitude, as at t2 in (b) of FIG. 3, time is required for the voltage across a transistor protecting Zener diode D to fall below a cut-off voltage. Therefore, the actual current IACT gradually declines from time t2 to time t3, as shown in (b) of FIG. 3. This means that the actual current IACT flowing into the solenoid 13c will have a triangular waveform, of the type shown in (b) of FIG. 3, that is dependent upon the pulse current having the rectangular waveform shown in (a) of FIG. 3, which current is supplied to the current controller 15 by the ECU 5. However, the period of the pulsed current from the ECU 5 is set at such a value that the actual current IACT will have a period shorter than the response delay time of the valve body 13a biased in the closing direction by the spring 13b. As a result, the lift of the proportional electromagnetic valve 13 undergoes a smooth, minute change without any major fluctuation, as illustrated in (d) of FIG. 3. Further, a voltage ve generated across the emitter resistance re serving as the current sensing element is smoothed by a capacitor C and then amplified by the amplifier 22 before being inputted to the ECU 5 as a voltage VA/D, shown in (c) of FIG. 3. The ECU 5 sets a target value of current, which is supplied to the solenoid 13c, corresponding to a desired idling speed set in dependence upon operating conditions of the engine and engine load, such as the electrical load thereof. The ECU 5 also varies, in response to the voltage value VA/D, the duty ratio DOUTA of the current supplied to the comparator 21, thereby performing feedback control in such a manner that the value of the current supplied to the solenoid 13c becomes equal to the target current value.

Figure 5:
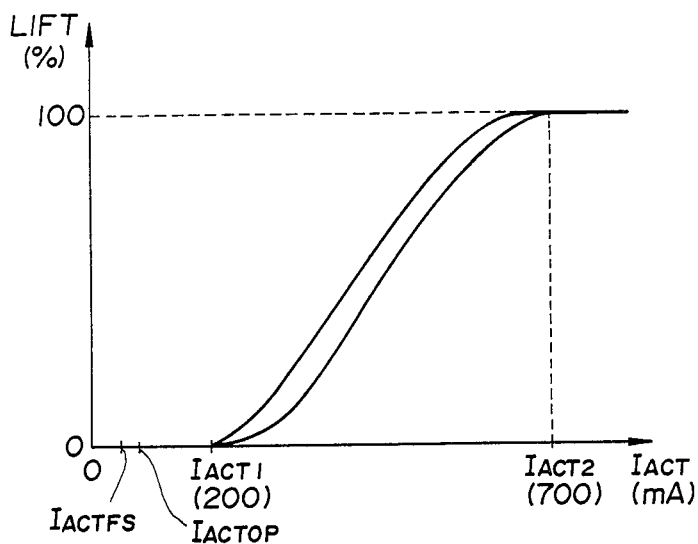
FIG. 5 is a graph showing the operating characteristics of a proportional electromagnetic valve for controlling a supply of air.
Figure 6:
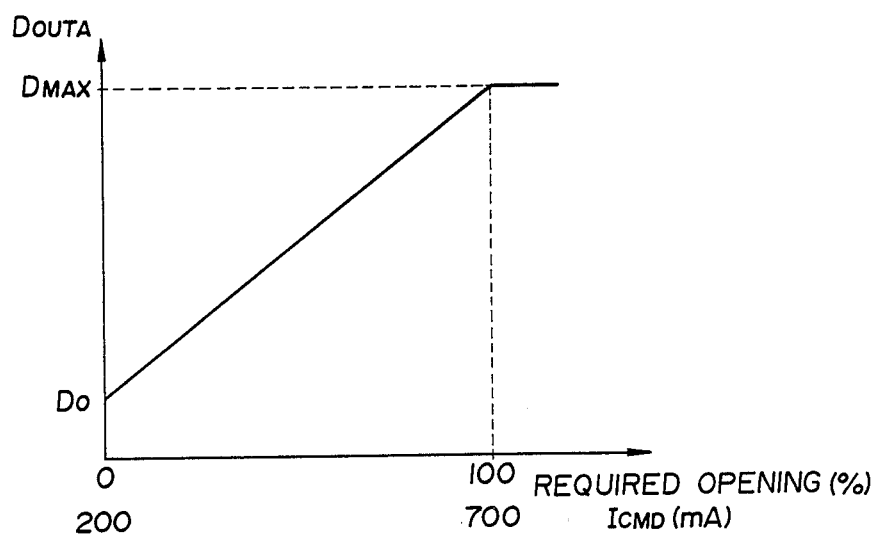
FIG. 6 is a graph showing the relationship between duty ratio DOUTA and required opening or energizing current (ICMD) of the proportional electromagnetic valve.

The proportional electromagnetic valve 13 is so adapted that the lift (Lift) of the valve body 13a will increase approximately in proportion to the value of current during the time that the actual current IACT energizing the solenoid 13c undergoes a transition from a predetermined value IACT1 (e.g. 200 mA) to a predetermined value IACT2 (e.g. 700 mA). However, since the valve body 13a is being urged by the spring 13b when the electromagnetic valve 13 is in the closed state, the valve is maintained in the closed state until the actual current IACT energizing the solenoid 13c surpasses the predetermined value IACT1, as shown in FIG. 5. Accordingly, when the engine is in such an operating condition that control of the proportional electromagnetic valve 13 is required, the ECU 5 constantly outputs a pulsed current of a duty ratio do at which the current that actually flows into the solenoid 13c has a minimum value corresponding to IACT1, even if the electromagnetic valve opening required is zero, i.e. the fully-closed state. The ECU 5 does this by using the conversion table shown in FIG. 6 so that control can be performed promptly. It should be noted that as shown in FIG. 5 the lift of the valve body 13a exhibits a hysteresis with respect to the actual current IACT between the lifting stroke and descending stroke of the valve body 13a. The reason for this is the magnetic hysteresis of the core in solenoid 13c, as well as mechanical friction thereof.

The electrical resistance of the solenoid 13c of the proportional electromagnetic valve 13 increases when the solenoid temperature rises due to its own electrical heating and heat received from the engine. The temperature of the solenoid 13c becomes substantially constant and, therefore, so does its electrical resistance, when an equilibrium state is attained in which the amount of neat received from heat sources such as the engine and the amount of dissipated heat become equal. However, since the solenoid temperature and, hence, its electrical resistance, rises until this equilibrium state is attained, the actual current IACT fluctuates and causes a variation in the amount of lift, so that the actual current does not agree with the required current value ICMD corresponding to the required opening of the electromagnetic valve. The ECU 5 therefore senses the actual current IACT from the aforementioned voltage VA/D and, in order to eliminate the offset between the sensed actual value of current IACT and the required current value ICMD, performs a calculation of the value of current applied to the solenoid 13c for modifying the duty ratio DOUTA of the outputted pulsed current in a feedback manner in accordance with the offset. The ECU 5 is thus capable of controlling the amount of lift of the proportional electromagnetic valve 13.

If a disconnection should happen to occur between the current controller 15 and solenoid 13c at a point A in the circuit of FIG. 2, a current iD flowing through the Zener diode D and the collector current ic of the transistor Tr2 both become zero (iD=0, ic=0). Accordingly, the base current ib of each of the transistors Tr1, Tr2 will become approximately equal to a value obtained by dividing a voltage value, which is the result of subtracting twice the base-emitter voltage drop vbe of the transistors Tr1, Tr2 from the output voltage vo of the comparator 21 (i.e. the output voltage of battery 16), by the sum of the resistance values of the base resistance rb and emitter resistance re, as indicated by the following equation (1):

$$ib \approx \frac{vo - vbe \times 2}{rb + re} \quad (1)$$

Since the current flowing into the emitter resistance re becomes equal to the base current ib, the voltage ve produced across the emitter resistor re is obtained in accordance with the following equation (2):

$$ve = ib \cdot re \quad (2)$$

As a result, the voltage VA/D applied to the ECU 5 may be obtained from Equations (1) and (2) by using the following equation (3), assuming that the amplification degree of the amplifier 22 is expressed by $$VA/D = G \cdot ve \approx G \cdot \frac{vo - vbe \times 2}{rb + re} \cdot re \quad (3)$$

Thus, if a disconnection occurs at the point A in FIG. 2, the ECU 5 will be capable of sensing the actual current IACT by detecting the input voltage V/AD expressed by Equation (3). Hereafter, the actual current which prevails at the disconnection shall be referred to as IACTOP. In addition, the values of the base resistance rb and emitter resistance re are set in such a manner that the value of IACTOP will become a value (e.g. 40 mA) smaller than the predetermined value IACT1. As noted before, it is also so arranged that a current of a value (e.g. IACT1=200 mA) greater than the value of IACTOP will always flow into the solenoid 13c when the proportional electromagnetic valve 13 is operating normally. As a result, when the ECU 5 senses that the actual current IACT has become approximately equal to the value of IACTOP, the ECU will, in effect, have detected the occurrence of a disconnection.

If, on the other hand, the point A between the current controller 15 and the solenoid 13c is shorted to ground, the base current ib of each of the transistors Tr1, Tr2 becomes zero (ib=0) because twice the base-emitted voltage drop vbe of the transistors Tr1, Tr2 is greater than the voltage drop vD across the Zener diode D. In other words, all of the current from the comparator 21 flows to ground at the point A through the Zener diode D. It should be noted that the current iD is equal to a value obtained by dividing a voltage value, which is the result of subtracting the voltage drop across the Zener diode D from the output voltage vo of the comparator 21, by the value of the base resistance rb [i.e. iD=-(vo−vD)/rb]. Furthermore, the collector current ic of the transistor Tr2 becomes zero (ic=0). Accordingly, the voltage V/AD applied to the ECU 5 is obtained in accordance with the following equation (4), the value being zero since ib=0:

$$VA/D = G \cdot ib \cdot re = 0 \quad (4)$$

Thus, if a short circuit (to ground) occurs at the point A in FIG. 2, the ECU 5 will sense the actual current IACT (=0) by detecting the input voltage VA/D expressed by Equation (4). Since a current (IACT1) will always flow through the solenoid 13c to some extent when the proportional electromagnetic valve 13 is operating normally, as mentioned above, the ECU 5 in effect senses the short circuit (to ground) when it senses that the actual current IACT has become equal to approximately zero.

Figure 4A:
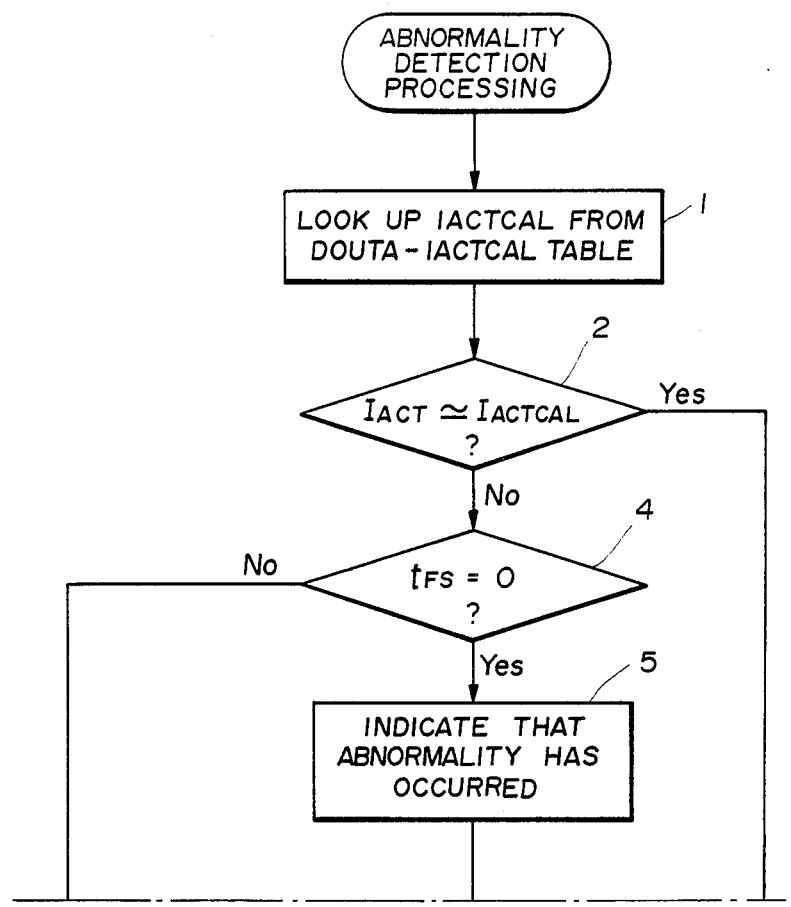
FIG. 4a timing chart showing the operating characteristics of the electromagnetic valve current controller.
Figure 4:
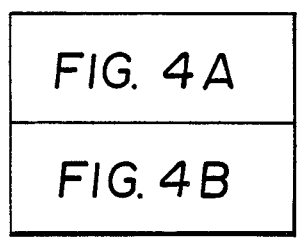
FIGS. 4,a, and 4b are a program flowchart of abnormality detection processing executed by an electronic control unit (ECU) in FIG. 1.
Figure 4B:
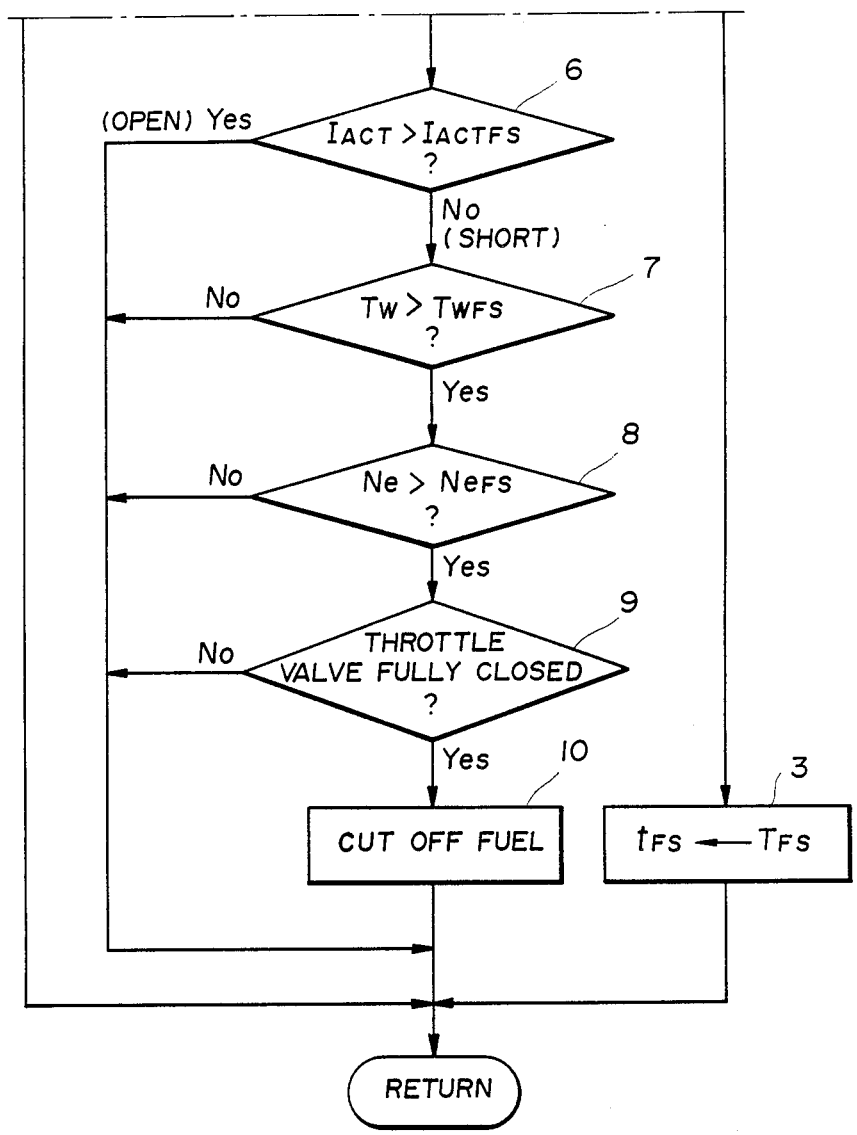

The manner in which the ECU 5 executes abnormality detection processing will now be described with reference to the flowchart of FIG. 4.

Figure 7:
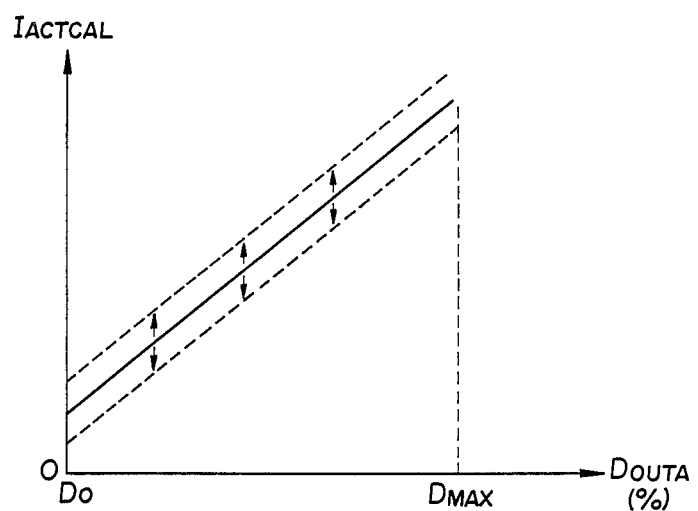
FIG. 7 is a view showing a table of duty ratio DOUTA and predicted energizing current IACTCAL.

First, in step 1 of the flowchart, the ECU 5 goes to a DOUTA-IACTCAL table shown in FIG. 7 to read out a value of current IACTCAL predicted for the solenoid 13c. The values of current IACTCAL in the table are set within a range that can be assumed when the electromagnetic valve current controller 15 is operating normally. Next, a step 2 of the flowchart calls for the ECU 5 to determine whether the detected actual current value IACT is approximately equal to the predicted current value IACTCAL, namely whether the value of IACT falls in the range between the dashed lines in FIG. 7. If the decision rendered at the step 2 is YES, that is, when the electromagnetic valve current controller 15 is operating normally, then the program proceeds to a step 3, at which a predetermined timer value TFS (e.g. 10 sec) is set in a tFS timer, the status of which is discriminated at a step 4, described below. The present program ends following execution of the step 3.

If a NO answer is obtained at the step 2, then it is determined at the step 4 whether the status of the tFS timer is zero. If the answer is NO, then the ECU 5 ends the present program. As a result, a decision to the effect that an abnormal state has occurred is suspended until passage of the predetermined time TFS from the YES decision rendered at the step 2 to judge that the electromagnetic valve current controller 15 is operating normally.

When a YES answer is obtained at the step 4, the program proceeds to a step 5, at which an indication is given to the effect that a fault has developed in the drive circuitry of the proportional electromagnetic valve 13. This is followed by a step 6, at which the ECU 5 determines whether the detected actual current value IACT is greater than a predetermined current value IACTFS (e.g. 30 mA), which is smaller tnan the aforementioned current value IACTOP that prevails at the time of a short circuit. If an affirmative decision (YES) is rendered at the step 6, then the detected current value is IACTOP. This means that a disconnection (indicated by OPEN in FIG. 4) has occurred at e.g. the point A in FIG. 2. In the illustrated embodiment, the proportional electromagnetic valve 13 is closed by the spring 13b, thereby lowering the idling rotational speed of the engine, when a disconnection occurs. However, since the driver can adjust for this by stepping down on the accelerator pedal, no processing for dealing with this abnormality is carried out. Accordingly, the ECU 5 ends the present program as soon as a YES answer is obtained at the step 6.

If a NO answer is obtained at the step 6, on the other hand, then the detected actual current is zero, meaning that a short to ground has been sensed at e.g. the point A in FIG. 2. In the illustrated embodiment, a current flows into the solenoid 13c directly (i.e. without being subjected to control) from the battery 16 when a short develops at the point A, as a result of which the proportional electromagnetic valve 13 assumes a fully open state to raise the idling rotational speed of the engine 1. There is no way for the driver to adjust for this malfunction. Accordingly, processing for dealing with this abnormal condition is executed from the step 7 onward. This processing entails determining at the step 7 whether the engine coolant temperature Tw is higher than a predetermined temperature TWFS, determining at a step 8 whether the engine rotational speed Ne is higher than a predetermined rotational speed NEFS, determining whether the throttle opening $\theta$TH is zero (fully closed) at a step 9, cutting off the fuel at the fuel injection valve 6 at a step 10 when YES answers are received at the steps 7, 8 and 9, that is, when there is no fear of engine stalling due to effecting fuel cut-off and the driver intends to decelerate the engine or make same to run idle, followed by ending the present program. If a NO answer is received at any one of the steps 7, 8 and 9, this means that the fuel cut-off is inappropriate. The ECU 5 therefore immediately ends the present program without executing the step 10.

As set forth above, according to the invention, the actual value IACT of current is compared with the predetermined value IACTFS when it is sensed that the control signal and IACT do not exhibit a predetermined correlation. It is determined that the current controller 15 is open when IACT is greater than IACTFS and shorted when IACT is equal to or less than IACTFS. This makes it possible to determine whether an abnormality in the current controller 15 of the electromagnetic valve 13 is due to a disconnection or short circuit between the controller and the valve so that disconnection or short circuit can be dealt with through appropriate measures when the abnormality occurs.

As many apparently widely different embodiments of the present invention can be made without departing from the spirit and scope thereof, it is to be understood that the invention is not limited to the specific embodiments thereof except as defined in the appended claims.

What is claimed is:

1. A method of detecting an abnormality in an electromagnetic valve current controller of the type in which a power supply, a proportional control-type electromagnetic valve, a current control element for controlling current flowing into said electromagnetic valve in dependence upon a control signal supplied to said current control element by control means to thereby regulate the opening of said electromagnetic valve, and a current sensing element for sensing an actual value of said current flowing into said electromagnetic valve are connected in series to ground, and said control signal supplied to said current control element is controlled in a feedback manner responsive to the actual value of said current flowing into said electromagnetic valve sensed by said current sensing element, in a manner such that the actual value of said current flowing into said electromagnetic valve approaches a target value of said current that flows into said electromagnetic valve, the method comprising the steps of:

(a) determining whether said control signal and the actual value of said current flowing into said electromagnetic valve exhibit a predetermined correlation;

(b) comparing a value of current flowing into said current sensing element with a predetermined value when it is determined that said control signal and the actual value of said current flowing into said electromagnetic valve do not exhibit said predetermined correlation; and (c) determining whether said current controller is open or short circuited based on whether the value of said current flowing into said current sensing element is greater than said predetermined value.

2. A method as claimed in claim 1, wherein said predetermined correlation between said control signal and the actual value of said current flowing into said electromagnetic valve is satisfied when said electromagnetic valve current controller is operating normally.

3. A method as claimed in claim 1, wherein said step (c) comprises the steps of:

determining that said current controller is open when the value of said current flowing into said current sensing element is greater than said predetermined value, and determining that said current controller is short circuited when the value of said current flowing into said current sensing element is equal to or less than said predetermined value.

4. A method as claimed in claim 1, 2 or 3, wherein said predetermined value of the value of said current flowing into said current sensing element is set at a value smaller than a value of the value of said current flowing into said current sensing element that prevails when said electromagnetic valve current controller is open.

5. A method as claimed in claim 1, 2 or 3, wherein said proportional control-type electromagnetic valve includes a solenoid connected between said power supply and said current control element, said electromagnetic valve current controller being determined to be open when a discon- nection occurs between said solenoid and said first current control element, and said electromagnetic valve current controller being determined to be short circuited when a junction of said solenoid with said current control element is shorted to ground.

* * * * *